US00RE50471E

(19) United States
(12) Reissued Patent
Kato et al.

(10) Patent Number: US RE50,471 E
(45) Date of Reissued Patent: Jun. 24, 2025

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventors: Daimotsu Kato, Kawasaki (JP); Toshiya Yonehara, Yamato (JP); Hiroshi Ono, Setagaya (JP); Yosuke Kajiwara, Yokohama (JP); Masahiko Kuraguchi, Yokohama (JP); Tatsuo Shimizu, Shinagawa (JP)

(73) Assignees: Kabushiki Kaisha Toshiba, Tokyo (JP); Toshiba Electronic Devices & Storage Corporation, Tokyo (JP)

(21) Appl. No.: 17/682,427

(22) Filed: Feb. 28, 2022

Related U.S. Patent Documents

Reissue of:
(64) Patent No.: 10,916,646
Issued: Feb. 9, 2021
Appl. No.: 16/297,776
Filed: Mar. 11, 2019

(30) Foreign Application Priority Data

Jun. 19, 2018 (JP) ..... 2018-116257

(51) Int. Cl.
*H01L 29/778* (2006.01)
*H01L 21/285* (2006.01)
(Continued)

(52) U.S. Cl.
CPC ..... *H10D 30/475* (2025.01); *H01L 21/28575* (2013.01); *H10D 30/015* (2025.01); *H10D 64/513* (2025.01); *H10D 64/667* (2025.01)

(58) Field of Classification Search
CPC ..... H01L 29/7848; H01L 29/045; H01L 29/0669; H01L 29/0673; H01L 29/1033;
(Continued)

(56) References Cited

U.S. PATENT DOCUMENTS 5,849,634 A * 12/1998 Iwata ..... H01L 29/66628 257/E21.151
2004/0108573 A1* 6/2004 Herner ..... H01L 23/5252 257/530
(Continued)

FOREIGN PATENT DOCUMENTS

JP 2009-054807 3/2009
JP 2009-200096 A 9/2009
(Continued)

*Primary Examiner* — Leonardo Andujar
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor regions, and a first insulating film. The first semiconductor region includes a first partial region, a second partial region, a third partial region between the first and second partial regions, a fourth partial region between the first and third partial regions, and a fifth partial region between the third and second partial regions. The second semiconductor region includes a sixth partial region and a seventh partial region. The third electrode overlaps the sixth and seventh partial regions. The first insulating film includes a portion provided between the third electrode and the third partial region, between the third electrode and the fourth partial region, between the third electrode and the fifth partial region, between the third electrode and the sixth partial region, and between the third electrode and the seventh partial region.

17 Claims, 11 Drawing Sheets

(51) Int. Cl.

| | |
|---|---|
| ***H01L 29/205*** | (2006.01) |
| ***H01L 29/423*** | (2006.01) |
| ***H01L 29/49*** | (2006.01) |
| ***H01L 29/66*** | (2006.01) |
| ***H10D 30/01*** | (2025.01) |
| ***H10D 30/47*** | (2025.01) |
| ***H10D 64/27*** | (2025.01) |
| ***H10D 64/66*** | (2025.01) |

(58) Field of Classification Search
CPC ..... H01L 29/165; H01L 29/42392; H01L 29/66795; H01L 29/775; H01L 29/785; H01L 29/7851; H01L 29/78618; H01L 29/78696; H01L 2029/7858; H01L 29/1079; H01L 29/66439; H01L 29/7842; B82Y 10/00
See application file for complete search history.

(56) References Cited

U.S. PATENT DOCUMENTS

2005/0189561 A1* 9/2005 Kinzer ..... H01L 27/0605 257/192
2009/0206371 A1 8/2009 Oka
2010/0127275 A1* 5/2010 Takehiko ..... H01L 29/66462 257/E21.441
2011/0241017 A1* 10/2011 Ikeda ..... H01L 29/7787 257/76
2012/0043617 A1 2/2012 Nakagawa et al.
2013/0256623 A1* 10/2013 Kim ..... C23C 14/081 257/4
2014/0042446 A1* 2/2014 Chiang ..... H01L 29/66462 257/E21.403
2014/0239350 A1* 8/2014 Chou ..... H01L 27/088 257/195
2015/0076508 A1* 3/2015 Saito ..... H01L 29/4236 257/76
2015/0145004 A1 5/2015 Inoue et al.
2017/0069748 A1* 3/2017 Shibata ..... H01L 29/66462
2017/0170306 A1 6/2017 Nakayama et al.
2018/0204916 A1 7/2018 Shimizu et al.

FOREIGN PATENT DOCUMENTS

JP 2014-045146 3/2014
JP 2015-103780 A 6/2015
JP 2015-153812 8/2015
JP 2016-039327 3/2016
JP 6093190 3/2017
JP 2017-107970 6/2017
JP 2018-117114 7/2018
WO WO 2010-125810 A1 11/2010

* cited by examiner

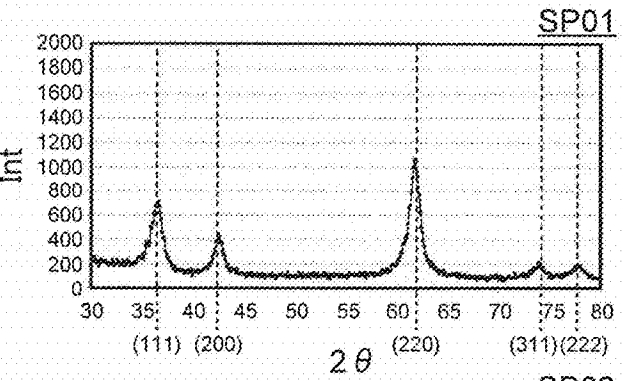
FIG. 3A
FIG. 3B
FIG. 3C
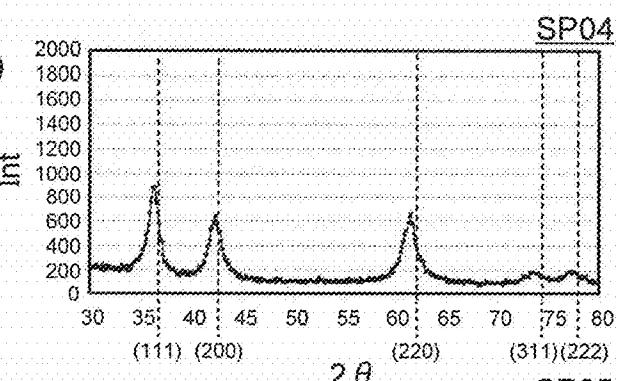
FIG. 3D
FIG. 3E

SEMICONDUCTOR DEVICE AND METHOD FOR MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is a reissue application of U.S. Pat. No. 10,916,646, filed on Mar. 11, 2019 as U.S. application Ser. No. 16/297,776; and* is based upon and claims the benefit of priority from Japanese Patent Application No. 2018-116257, filed on Jun. 19, 2018; the entire contents of which are incorporated herein by reference.

FIELD

Embodiments described herein relate generally to a semiconductor device and a method for manufacturing the same.

BACKGROUND

For example, there is a semiconductor device that uses a nitride semiconductor. It is desirable for the semiconductor device to have stable characteristics.

BRIEF DESCRIPTION OF THE DRAWINGS

FIG. 3A to FIG. 3E are graphs illustrating the X-ray analysis measurement results of the samples;

DETAILED DESCRIPTION

Figure 1:
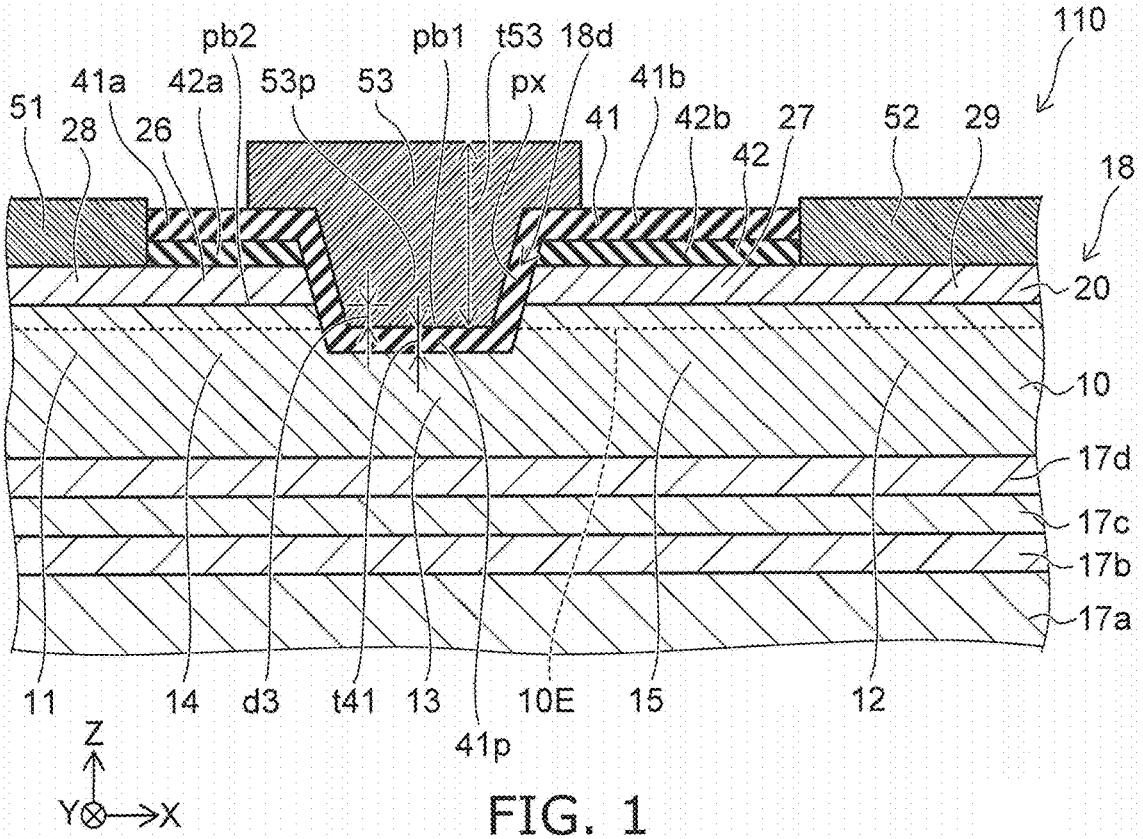
FIG. 1 is a schematic cross-sectional view illustrating a semiconductor device according to a first embodiment.

According to one embodiment, a semiconductor device includes first to third electrodes, a first semiconductor region, a second semiconductor region, and a first insulating film. The first semiconductor region includes [$Al_{x2}Ga_{1-x2}N$] *$Al_{x1}Ga_{1-x1}N$* ($0 \leq x1 < 1$). The first semiconductor region includes a first partial region, a second partial region, a third partial region between the first partial region and the second partial region, a fourth partial region between the first partial region and the third partial region, and a fifth partial region between the third partial region and the second partial region. A first direction from the first partial region toward the first electrode crosses a second direction. The second direction is from the first electrode toward the second electrode. A direction from the second partial region toward the second electrode is aligned with the first direction. The second semiconductor region includes $Al_{x2}Ga_{1-x2}N$ ($0 < x2 \leq 1$ and $x1 < x2$). The second semiconductor region includes a sixth partial region and a seventh partial region. A direction from the fourth partial region toward the sixth partial region is aligned with the first direction. A direction from the fifth partial region toward the seventh partial region is aligned with the first direction. A direction from the third partial region toward the third electrode is aligned with the first direction. The third electrode overlaps the sixth partial region and the seventh partial region in the second direction. The first insulating film includes a portion provided between the third electrode and the third partial region, between the third electrode and the fourth partial region, between the third electrode and the fifth partial region, between the third electrode and the sixth partial region, and between the third electrode and the seventh partial region. In an X-ray analysis measurement, a ratio of a second peak intensity to a first peak intensity is 1.5 or more. The first peak intensity corresponds to a (111) orientation of the third electrode. The second peak intensity corresponds to a (220) orientation of the third electrode.

According to another embodiment, a semiconductor device includes first to third electrodes, a first semiconductor region, a second semiconductor region, and a first insulating film. The first semiconductor region includes [$Al_{x2}Ga_{1-x2}N$] *$Al_{x1}Ga_{1-x1}N$* ($0 \leq x1 < 1$). The first semiconductor region includes a first partial region, a second partial region, a third partial region between the first partial region and the second partial region, a fourth partial region between the first partial region and the third partial region, and a fifth partial region between the third partial region and the second partial region. A first direction from the first partial region toward the first electrode crosses a second direction. The second direction is from the first electrode toward the second electrode. A direction from the second partial region toward the second electrode is aligned with the first direction. The second semiconductor region includes $Al_{x2}Ga_{1-x2}N$ ($0 < x2 \leq 1$ and $x1 < x2$). The second semiconductor region includes a sixth partial region and a seventh partial region. A direction from the fourth partial region toward the sixth partial region is aligned with the first direction. A direction from the fifth partial region toward the seventh partial region is aligned with the first direction. The third electrode includes titanium and nitrogen. A direction from the third partial region toward the third electrode is aligned with the first direction. The third electrode overlaps the sixth partial region and the seventh partial region in the second direction. A density of the third electrode is 3.93 g/cm$^3$ or less. The first insulating film includes a portion provided between the third electrode and the third partial region, between the third electrode and the fourth partial region, between the third electrode and the fifth partial region, between the third electrode and the sixth partial region, and between the third electrode and the seventh partial region.

According to another embodiment, a method for manufacturing a semiconductor device is disclosed. The method can include forming a recess in a stacked body by removing a portion of the stacked body. The stacked body includes a first semiconductor region and a second semiconductor region. The first semiconductor region includes [$Al_{x2}Ga_{1-x2}N$] $Al_{x1}Ga_{1-x1}N$ ($0 \leq x1 < 1$). The second semiconductor region includes $Al_{x2}Ga_{1-x2}N$ ($0 < x2 \leq 1$ and $x1 < x2$). The recess reaches the first semiconductor region from the second semiconductor region. The method can include forming a first insulating film in the recess, and forming a conductive film by sputtering in a space remaining in the recess after the forming of the first insulating film. The conductive film includes a metallic element and nitrogen. The sputtering is performed using a target including the metallic element. The sputtering is performed in an atmosphere including argon and nitrogen and having a ratio of a flow rate of nitrogen to a flow rate of argon not less than 0.077 and not more than 0.16.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor region 10, a second semiconductor region 20, and a first insulating film 41.

The first semiconductor region 10 includes [$Al_{x2}Ga_{1-x2}N$] $Al_{x1}Ga_{1-x1}N$ ($0 \leq x1 < 1$). In one example, the first semiconductor region 10 is a GaN layer. The first semiconductor region 10 includes first to fifth partial regions 11 to 15. The third partial region 13 is between the first partial region 11 and the second partial region 12. The fourth partial region 14 is between the first partial region 11 and the third partial region 13. The fifth partial region 15 is between the third partial region 13 and the second partial region 12.

A first direction from the first partial region 11 toward the first electrode 51 crosses a second direction from the first electrode 51 toward the second electrode 52.

The first direction is taken as a Z-axis direction. One direction perpendicular to the Z-axis direction is taken as an X-axis direction. A direction perpendicular to the Z-axis direction and the X-axis direction is taken as a Y-axis direction. The second direction is, for example, the X-axis direction.

The direction from the second partial region 12 toward the second electrode 52 is aligned with the first direction (the Z-axis direction). The first partial region 11 is a portion corresponding to the first electrode 51. The second partial region 12 is a portion corresponding to the second electrode 52.

The second semiconductor region 20 includes $Al_2Ga_{1-x2}N$ ($0 < x2 \leq 1$ and $x1 < x2$). The second semiconductor region 20 is, for example, an AlGaN layer. The second semiconductor region 20 includes a sixth partial region 26 and a seventh partial region 27. The direction from the fourth partial region 14 toward the sixth partial region 26 is aligned with the first direction (the Z-axis direction). The direction from the fifth partial region 15 toward the seventh partial region 27 is aligned with the first direction. In the example, the second semiconductor region 20 further includes an eighth partial region 28 and a ninth partial region 29. The eighth partial region 28 is between the first partial region 11 and the first electrode 51 in the first direction. The ninth partial region 29 is between the second partial region 12 and the second electrode 52 in the first direction.

The direction from the third partial region 13 toward the third electrode 53 is aligned with the first direction (the Z-axis direction). The position along the second direction (e.g., the X-axis direction) of the third electrode 53 is between the position along the second direction of the first electrode 51 and the position along the second direction of the second electrode 52.

The third electrode 53 overlaps the sixth partial region 26 and the seventh partial region 27 in the second direction (e.g., the X-axis direction). In the example, the third electrode 53 further overlaps the fourth partial region 14 and the fifth partial region 15 in the second direction. For example, a recess portion (which may be a hole) is provided in a portion of the second semiconductor region 20. At least a portion of the third electrode 53 is filled into the recess portion of the second semiconductor region 20. For example, a recess portion (a recess) may be provided in a portion of the first semiconductor region 10. At least a portion of the third electrode 53 may be filled into the recess portion of the first semiconductor region 10.

For example, a stacked body 18 that includes the first semiconductor region 10 and the second semiconductor region 20 recited above is provided; and the recess portion can be formed by forming a recess 18d in the stacked body 18.

For example, the third electrode 53 has an NaCl-type crystal structure. In one example, the third electrode 53 includes titanium and nitrogen. The third electrode 53 includes, for example, TiN.

The first insulating film 41 includes a portion px provided between the third electrode 53 and the third partial region 13, between the third electrode 53 and the fourth partial region 14, between the third electrode 53 and the fifth partial region 15, between the third electrode 53 and the sixth partial region 26, and between the third electrode 53 and the seventh partial region 27.

For example, a two-dimensional electron gas 10E (2DEG) is formed in a portion of the first semiconductor region 10 on the second semiconductor region 20 side. For example, the first electrode 51 functions as a source electrode. For example, the second electrode 52 functions as a drain electrode. For example, the third electrode 53 functions as a gate electrode. The portion px of the first insulating film 41 recited above functions as a gate insulating film. For example, the first semiconductor region 10 functions as a channel layer. For example, the second semiconductor region 20 functions as an electron supply layer.

In the example, the semiconductor device 110 further includes a second insulating film 42. The sixth partial region 26 is provided between the fourth partial region 14 and a portion 42a of the second insulating film 42 in the first direction (the Z-axis direction). The seventh partial region 27 is provided between the fifth partial region 15 and another portion 42b of the second insulating film 42. The composition of the second insulating film 42 is different from the composition of the first insulating film 41.

For example, the second insulating film 42 includes nitrogen; and the first insulating film 41 does not include nitrogen. Or, the concentration of nitrogen in the first insulating film 41 is lower than the concentration of nitrogen in the second insulating film 42. For example, the first insulating film 41 includes silicon oxide; and the second insulating film 42 includes silicon nitride. For example, the first insulating film 41 may be a $SiO_2$ film. The second insulating film 42 may be a SiN film. By providing a film including nitrogen (e.g., a SiN film) on the second semiconductor region 20, stable characteristics of the second semiconductor region 20 are obtained.

For example, the portion 42a of the second insulating film 42 recited above is provided between the sixth partial region 26 and a portion 41a of the first insulating film 41. The other portion 42b of the second insulating film 42 recited above is provided between the seventh partial region 27 and another portion 41b of the first insulating film 41.

In the example, a base body 17a and semiconductor regions 17b to 17d are provided; and the first semiconductor region 10 and the second semiconductor region 20 are provided on the base body 17a and the semiconductor regions 17b to 17d. The base body 17a is, for example, a Si substrate. The semiconductor region 17b is, for example, an $Al_{y1}Ga_{1-y1}N$ (a $0<y1\leq1$) layer. The semiconductor region 17c is, for example, an $Al_{y2}Ga_{1-y2}N$ (a $0\leq y2<y1$) layer. The semiconductor region 17d is, for example, a GaN layer including carbon.

The semiconductor device 110 includes a recessed gate electrode. The semiconductor device 110 performs a normally-off operation. The threshold voltage of the semiconductor device 110 is, for example, positive.

In the embodiment, the third electrode 53 has special characteristics described below. The threshold voltage increases thereby. Stable operations are obtained because a high threshold voltage is obtained.

Examples of a relationship between the third electrode 53 and the electrical characteristics of the semiconductor device will now be described. Current-voltage (I-V characteristic) measurement results of two types of samples will now be described in which the formation conditions of the third electrode 53 are changed.

Figure 2:
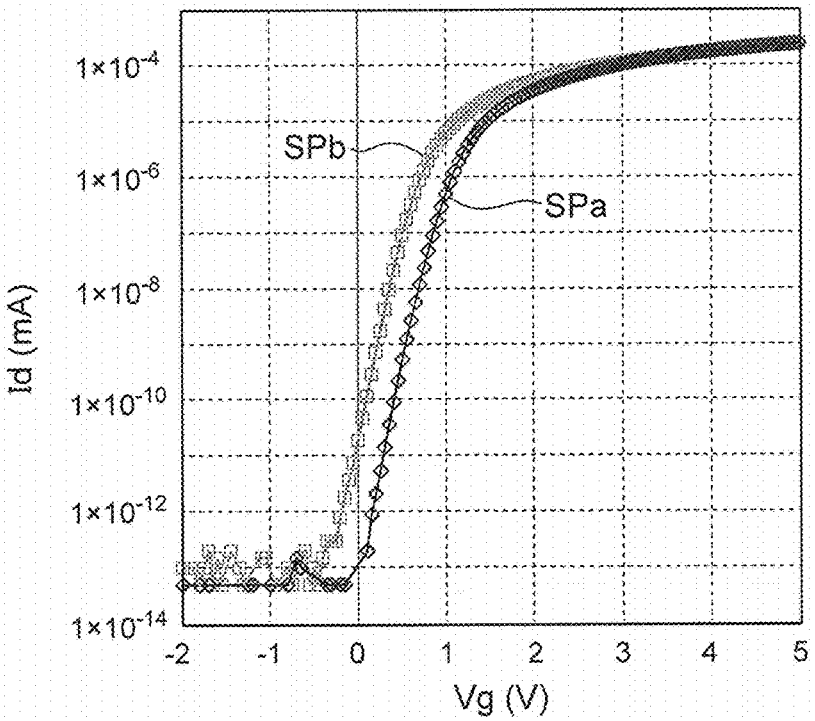
FIG. 2 is a graph illustrating a characteristic of the semiconductor device.

FIG. 2 is a graph illustrating a characteristic of the semiconductor device.

The horizontal axis of FIG. 2 is a gate voltage Vg (V). The vertical axis is a drain current Id (mA). The characteristics of a first measurement sample SPa and a second measurement sample SPb are shown in FIG. 2. In these samples, the third electrode 53 is a TiN film. The TiN film is formed by sputtering using a target of Ti. The gas of the sputtering is modified between these samples. For the first measurement sample SPa, the ratio of the Ar (argon) gas flow rate/N (nitrogen) gas flow rate is 48/8. For the second measurement sample SPb, the ratio of the Ar gas flow rate/N gas flow rate is 8/48.

As shown in FIG. 2, the I-V characteristic of the first measurement sample SPa is shifted toward the right (positive) with respect to the I-V characteristic of the second measurement sample SPb. For example, the gate voltage Vg when the drain current Id is $1\times10^{-6}$ mA is taken as the threshold voltage. The threshold voltage for the first measurement sample SPa is about 1.01 V. The threshold voltage for the second measurement sample SPb is about 0.64 V. The threshold voltage for the first measurement sample SPa is 0.35 V higher than the threshold voltage for the second measurement sample SPb. Thus, it was found that the threshold voltage increases due to the conditions of the third electrode 53.

An example of results of an experiment in which the formation conditions of the TiN film are changed will now be described. In the one experiment, a TiN film is formed by sputtering on a $SiO_2$ film. The Ar gas flow rate and the $N_2$ gas flow rate of the sputtering are modified. The sputtering is, for example, reactive sputtering. These gases are, for example, reactant gases.

In a sample SP01, the Ar gas flow rate is 28 sccm; and the $N_2$ gas flow rate is 28 sccm.

In a sample SP02, the Ar gas flow rate is 48 sccm; and the $N_2$ gas flow rate is 8 sccm.

In a sample SP03, the Ar gas flow rate is 19 sccm; and the $N_2$ gas flow rate is 37 sccm. In a sample SP04, the Ar gas flow rate is 8 sccm; and the $N_2$ gas flow rate is 48 sccm.

In a sample SP05, the Ar gas flow rate is 37 sccm; and the $N_2$ gas flow rate is 19 sccm.

The first measurement sample SPa recited above corresponds to the sample SP02. The second measurement sample SPb recited above corresponds to the sample SP04.

Samples SP11 to SP15 also are made. In the samples SP11 to SP15, a TiN film is formed by sputtering on a Si (100) substrate. The Ar gas flow rate and the $N_2$ gas flow rate of the samples SP11 to SP15 are the same as the Ar gas flow rate and the $N_2$ gas flow rate of the samples SP01 to SP05.

For the samples SP01 to SP05 and the samples SP11 to SP15, the pressure when sputtering is 0.5 Pa; and the electrical power of the sputtering is 1 kW. The thickness of the TiN film that is formed is about 100 nm.

An example of X-ray analysis measurement results of these samples will now be described.

FIG. 3A to FIG. 3E and FIG. 4A to FIG. 4E are graphs illustrating the X-ray analysis measurement results of the samples.

FIG. 3A to FIG. 3E correspond to the samples SP01 to SP05; and FIG. 4A to FIG. 4E correspond to the samples SP11 to SP15. In these figures, the horizontal axis is an angle 2θ (degrees). In these figures, the vertical axis is an intensity Int of the signal.

As shown in these figures, peaks that correspond to the orientation relating to the (111) plane, the orientation relating to the (200) plane, the orientation relating to the (220) plane, the orientation relating to the (311) plane, and the orientation relating to the (222) plane are observed.

Figure 4D:
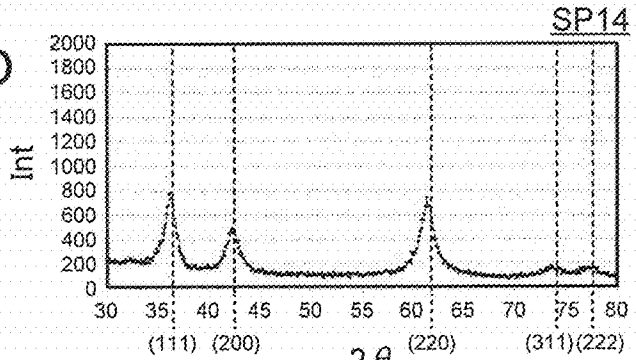
FIG. 4A to FIG. 4E are graphs illustrating the X-ray analysis measurement results of the samples.
Figure 4E:
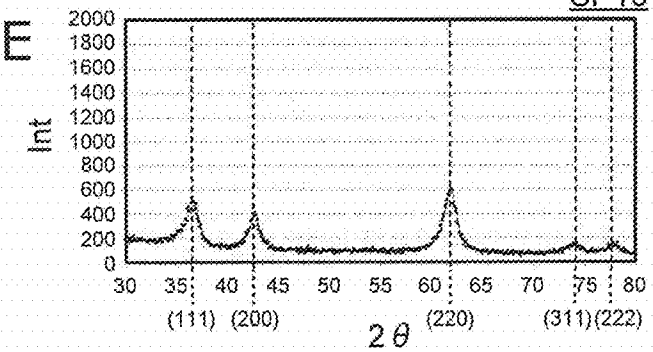
Figure 4A:
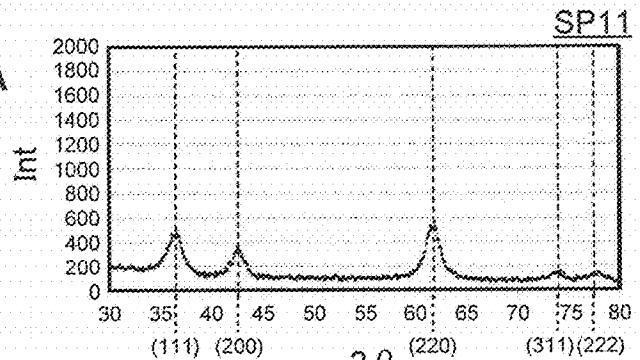
Figure 4B:
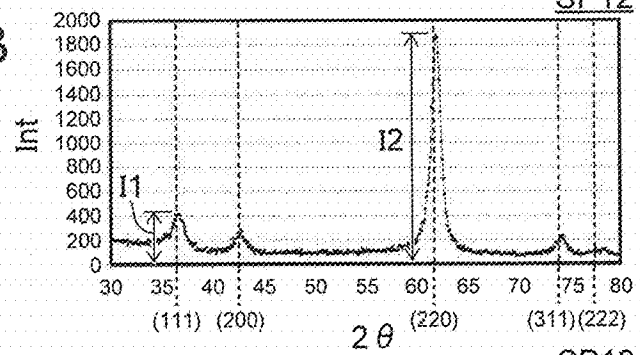
Figure 4C:
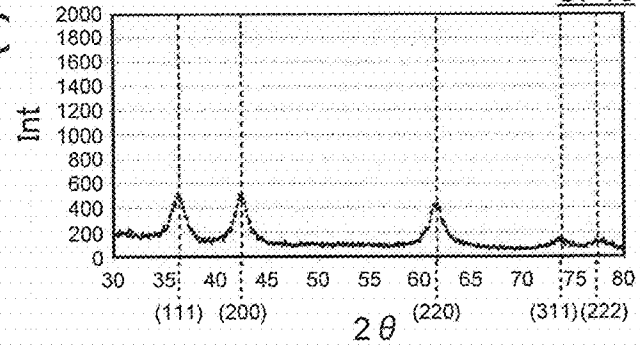

As shown in FIG. 3B and FIG. 4B for the sample SP02 and the sample SP12, the intensity Int of the peak corresponding to the orientation relating to the (220) plane is intense compared to the other samples. Thus, the properties of the obtained film (TiN) are different according to the formation conditions of the TiN film.

An example of measurement results of other characteristics of these samples will now be described.

Figure 5A:
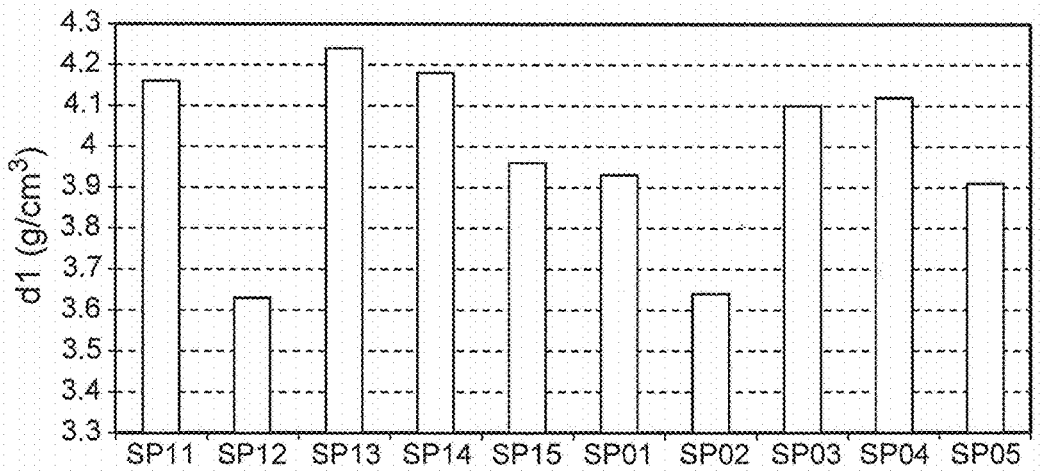
FIG. 5A and FIG. 5B are graphs illustrating characteristics of the samples.
Figure 5B:
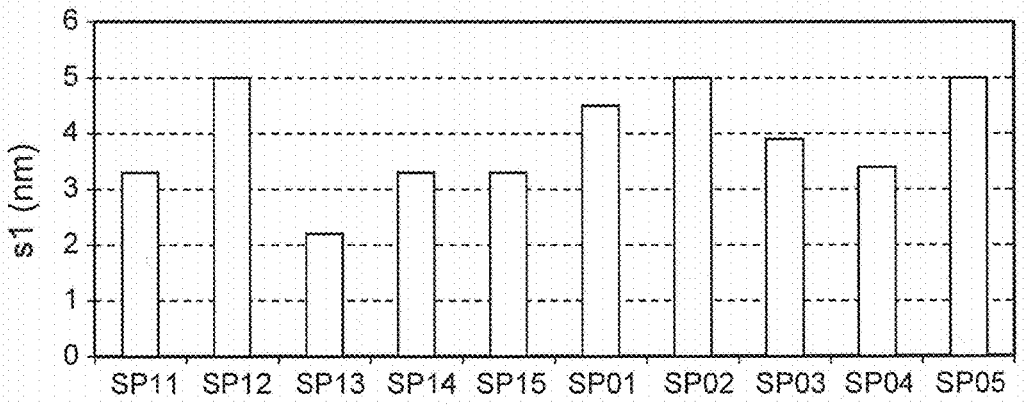

FIG. 5A and FIG. 5B are graphs illustrating characteristics of the samples.

In these figures, the horizontal axis corresponds to the samples SP11 to SP15 and the samples SP01 to SP05. The vertical axis of FIG. 5A is a density d1 ($g/cm^3$) of the film (the TiN film) of the sample. The density d1 is measured by X-ray reflectometry (XRR (X-ray Reflection)). The vertical axis of FIG. 5B is a surface roughness 51 (nm) of the film (the TiN film) of the sample. The surface roughness s1 corresponds to the surface roughness obtained by fitting from XRR measurement results.

As shown in FIG. 5A, the density d1 is low for the sample SP02 and the sample SP12 compared to the other samples.

For example, it is considered that the preferential crystal orientation of the film affects the density d1. For example, it is considered that in an NaCl-type crystal structure, the density of the (111) plane orientation is higher than the density of the (100) plane orientation. It is considered that the density of the (100) plane orientation is higher than the density of the (110) plane orientation.

For example, it is considered that the intense peak corresponding to the orientation relating to the (220) plane for the sample SP02 and the sample SP12 is related to the low density d1 of these samples.

It is considered that when the density d1 of the film is low, for example, the dielectric-constant characteristics of the film change; and the threshold voltage can be high thereby.

On the other hand, as shown in FIG. 5B, the roughness 51 is relatively large for the sample SP02 and the sample SP12. For example, it is considered that conditions for which the surface roughness of the film is small are generally employed due to considerations of the stability of the patterning of the film. Rather than the perspective of the roughness s1, a film is employed in the embodiment in which the conditions are such that the threshold voltage increases.

A "parameter R1" that focuses on the intensity Int of the peak corresponding to the orientation relating to the (220) plane is introduced. The parameter R1 is the ratio (I2/I1) of the intensity of the peak corresponding to the orientation relating to the (220) plane (an intensity I2 of FIG. 3A and FIG. 3B) to the intensity of the peak corresponding to the orientation relating to the (111) plane (an intensity I1 of FIG. 3A and FIG. 3B).

Figure 6A:
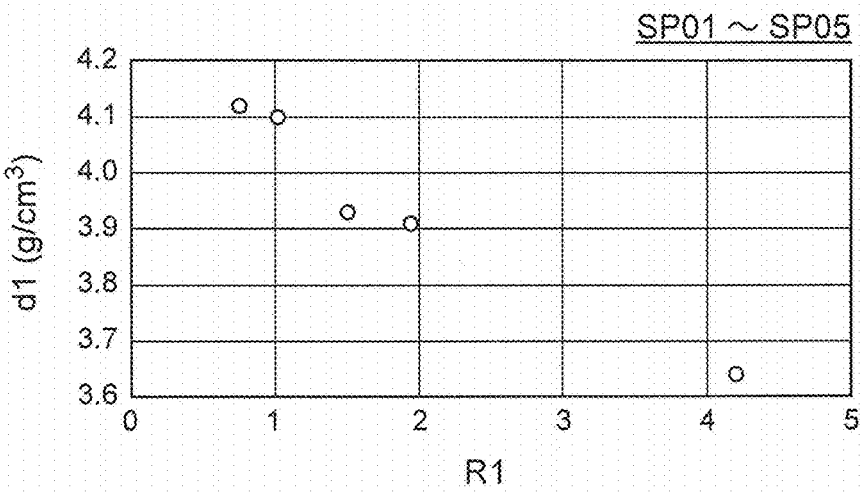
FIG. 6A and FIG. 6B are graphs illustrating characteristics of the samples.
Figure 6B:
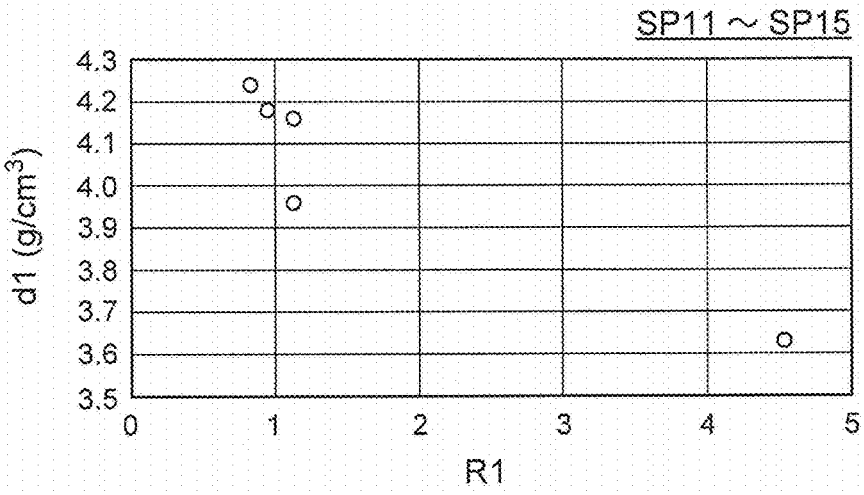

FIG. 6A and FIG. 6B are graphs illustrating characteristics of the samples.

In these figures, the horizontal axis is the parameter R1. The vertical axis is the density d1 (g/cm$^3$). FIG. 6A corresponds to the samples SP01 to SP05. FIG. 6B corresponds to the samples SP11 to SP15. It can be seen from these figures that the density d1 decreases as the parameter R1 increases.

The case where the TiN film is provided on a $SiO_2$ film corresponds to the samples SP01 to SP05. In such a case, it can be seen from FIG. 6A that the density d1 decreases steeply when the parameter R1 is 1.5 or more. It is considered that the density d1 can be reduced effectively when the parameter R1 is 1.5 or more. It is considered that the density d1 can be reduced more effectively when the parameter R1 is 2 or more. An extremely low density d1 is obtained when the parameter R1 is 4 or more.

Figure 7A:
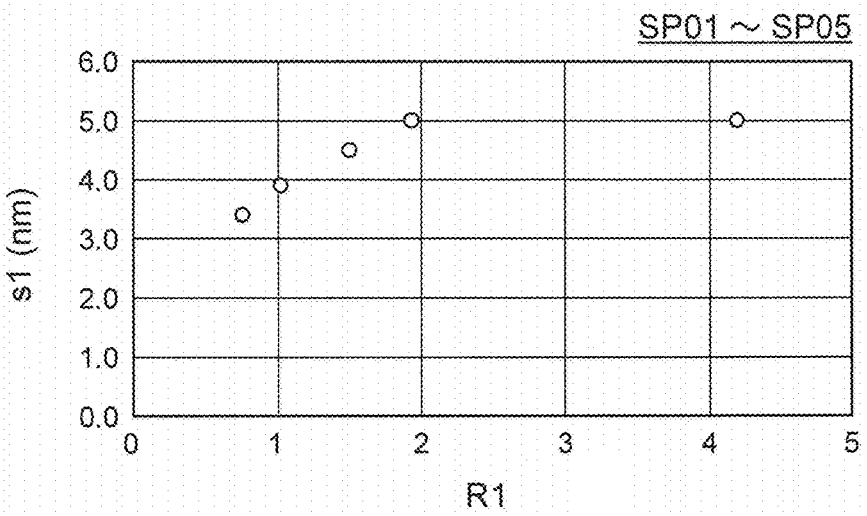
FIG. 7A and FIG. 7B are graphs illustrating characteristics of the samples.
Figure 7B:
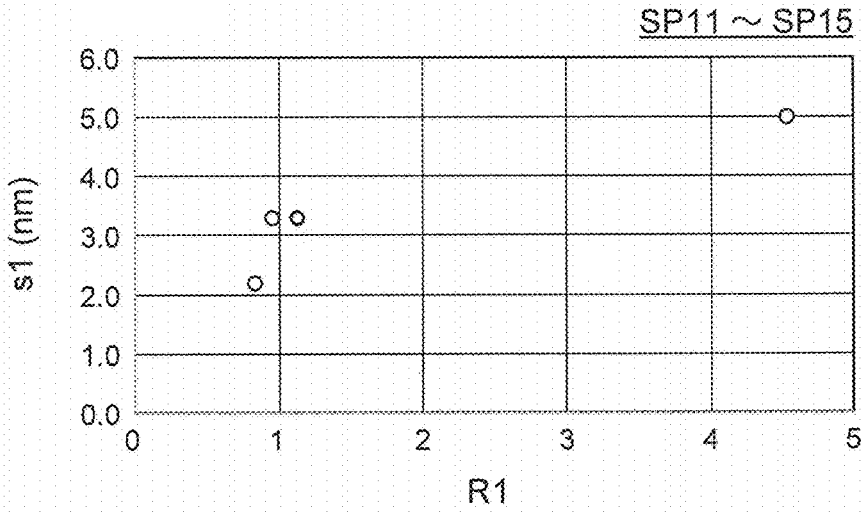

FIG. 7A and FIG. 7B are graphs illustrating characteristics of the samples.

In these figures, the horizontal axis is the parameter R1. The vertical axis is the surface roughness s1 (nm). FIG. 7A corresponds to the samples SP01 to SP05. FIG. 7B corresponds to the samples SP11 to SP15. It can be seen from these figures that the surface roughness 51 increases as the parameter R1 increases.

The case where the TiN film is provided on a $SiO_2$ film corresponds to the samples SP01 to SP05. It can be seen from FIG. 7A that the surface roughness s1 is substantially saturated when the parameter R1 is 1.5 or more in such a case. A pronounced increase of the surface roughness s1 is not observed in the range where the parameter R1 is 5 or less. If there is no pronounced change of the other characteristics, the parameter R1 may be 10 or less. The parameter R1 may be 20 or less.

In the embodiment, for example, the parameter R1 is set to be 1.5 or more. The density d1 of the film can be reduced effectively thereby. The parameter R1 may be 2 or more. The parameter R1 may be 4 or more.

For example, in the X-ray analysis measurement of the embodiment, the ratio of the second peak intensity (I2) corresponding to the (220) orientation of the third electrode 53 to the first peak intensity (I1) corresponding to the (111) orientation of the third electrode 53 is 1.5 or more. The ratio may be 2 or more. The ratio may be 4 or more. A low density d1 is obtained.

As shown in FIG. 6A, the density d1 is 3.93 g/cm$^3$ or less when the parameter R1 is 1.5 or more. The density d1 is 3.91 g/cm$^3$ or less when the parameter R1 is 2 or more. The density d1 is 3.63 g/cm$^3$ or less when the parameter R1 is 4 or more.

In the embodiment, in the case where the third electrode 53 includes titanium and nitrogen, for example, the density d1 of the third electrode 53 may be 3.93 g/cm$^3$ or less. The density d1 may be 3.91 g/cm$^3$ or less. The density d1 may be 3.63 g/cm$^3$ or less. A high threshold voltage is obtained by such low densities.

Figure 8A:
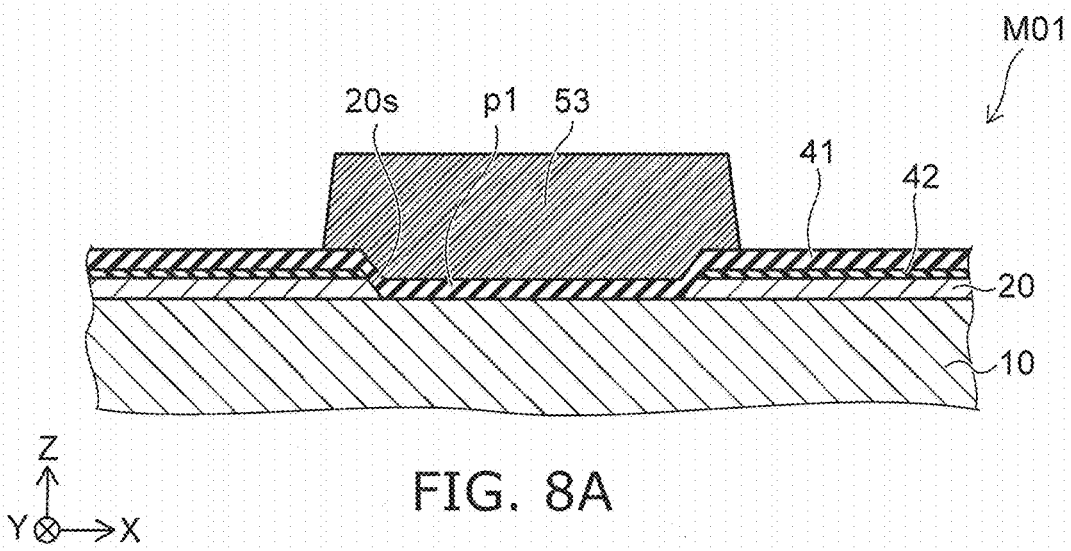
FIG. 8A and FIG. 8B are schematic cross-sectional views illustrating simulation results relating to the semiconductor device.
Figure 8B:
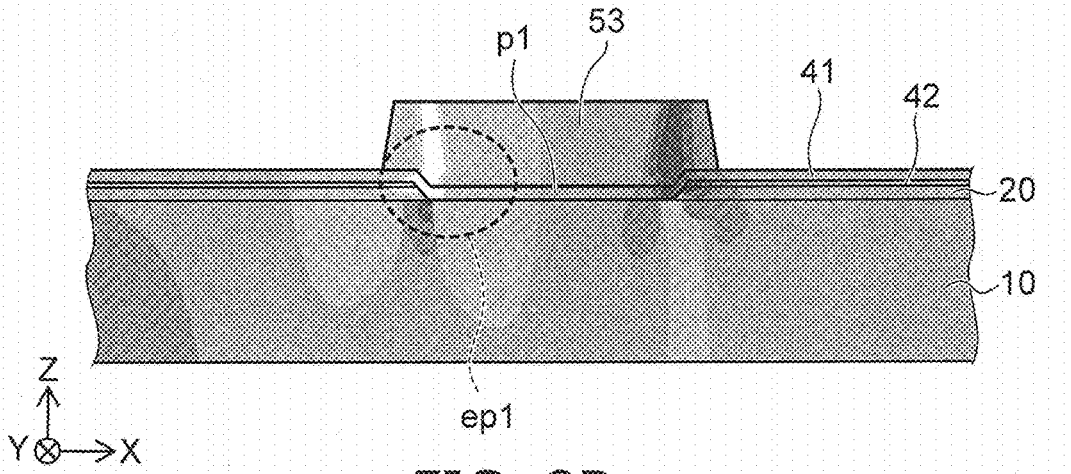

FIG. 8A and FIG. 8B are schematic cross-sectional views illustrating simulation results relating to the semiconductor device.

FIG. 8A illustrates a model M01 of the simulation. The first semiconductor region 10 is a GaN layer; and the second semiconductor region 20 is an $A_{0.25}Ga_{0.75}N$ layer. In the example, the third electrode 53 has stress (compressive stress) of −156 MPa. The first insulating film 41 and the second insulating film 42 each have stress (compressive stress) of −500 MPa. A shear stress is applied by these stresses to a portion (the recess end portion) of a side surface 20s of the second semiconductor region 20.

FIG. 8B schematically shows the intensity of the shear stress. In FIG. 8B, the portion where the darkness of the image is darkest corresponds to a positive shear stress. The portion where the darkness of the image is lightest corresponds to a negative shear stress. Shear stresses of magnitudes and polarities between the darkest and lightest are generated. It can be seen from FIG. 8B that a large shear stress is generated at the vicinity (a recess end portion ep1) of the side surface 20s of the second semiconductor region 20. For example, the shear stress generates a piezoelectric charge due to the stress. It is considered that the shear stress affects the movement of the charge along the X-Y plane.

In the first measurement sample SPa, the third electrode 53 has a structure in which the (220) plane orientation is preferential. The density d1 of the third electrode 53 is low thereby. Therefore, it is considered that the stress is relaxed easily in the third electrode 53. Thereby, it is considered that a high threshold is obtained in the first measurement sample SPa. For example, it is considered that the third electrode 53 greatly affects the residual stress of the entire element when the volume of the third electrode 53 is larger than the volume of the other component members (e.g., the first insulating film 41). It is considered that a piezoelectric charge is generated at the portion (the recess end portion) of the side surface 20s of the second semiconductor region 20; and a high threshold is obtained.

In the embodiment, the third electrode 53 includes a portion 53p overlapping the third partial region 13 in the first direction (the Z-axis direction) (referring to FIG. 1). A thickness t53 along the first direction of the overlapping portion 53p is not less than 10 nm and not more than 100 nm. When the thickness t53 is less than 10 nm, for example, the film properties easily become nonuniform in heat treatment in the film formation, when patterning, etc. Electrical disconnections occur easily when the film properties become nonuniform. When the film properties become nonuniform, for example, the desired work function may be difficult to obtain. When the thickness t53 exceeds 100 nm, for example, film separation occurs easily because the volume changes greatly due to the expansion in the heat treatment.

A portion of the third electrode 53 may be provided on the first insulating film 41. For example, the first insulating film 41 may be provided, in the first direction (the Z-axis direction), between the fourth partial region 14 and a portion of the third electrode 53 and between the fifth partial region 15 and another portion of the third electrode 53. For example, the peeling of the first insulating film 41, etc., can be suppressed.

The first insulating film 41 includes a first insulating portion 41p (referring to FIG. 1). The first insulating portion 41p is between the third electrode 53 and the third partial region 13 in the first direction (the Z-axis direction). The boundary between the first insulating portion 41p and the third electrode 53 is taken as a boundary pb1 (referring to FIG. 1). The boundary between the fourth partial region 14 and the sixth partial region 26 is taken as a boundary pb2. A distance d3 along the first direction (the Z-axis direction) between the position in the first direction of the boundary pb1 and the position in the first direction of the boundary pb2 is, for example, not less than 0.1 nm and not more than 15 nm. For example, the distance d3 corresponds to the recess depth.

A thickness t41 along the first direction (the Z-axis direction) of the first insulating portion 41p of the first insulating film 41 recited above is, for example, not less than 0.1 nm and not more than 50 nm.

Figure 9:
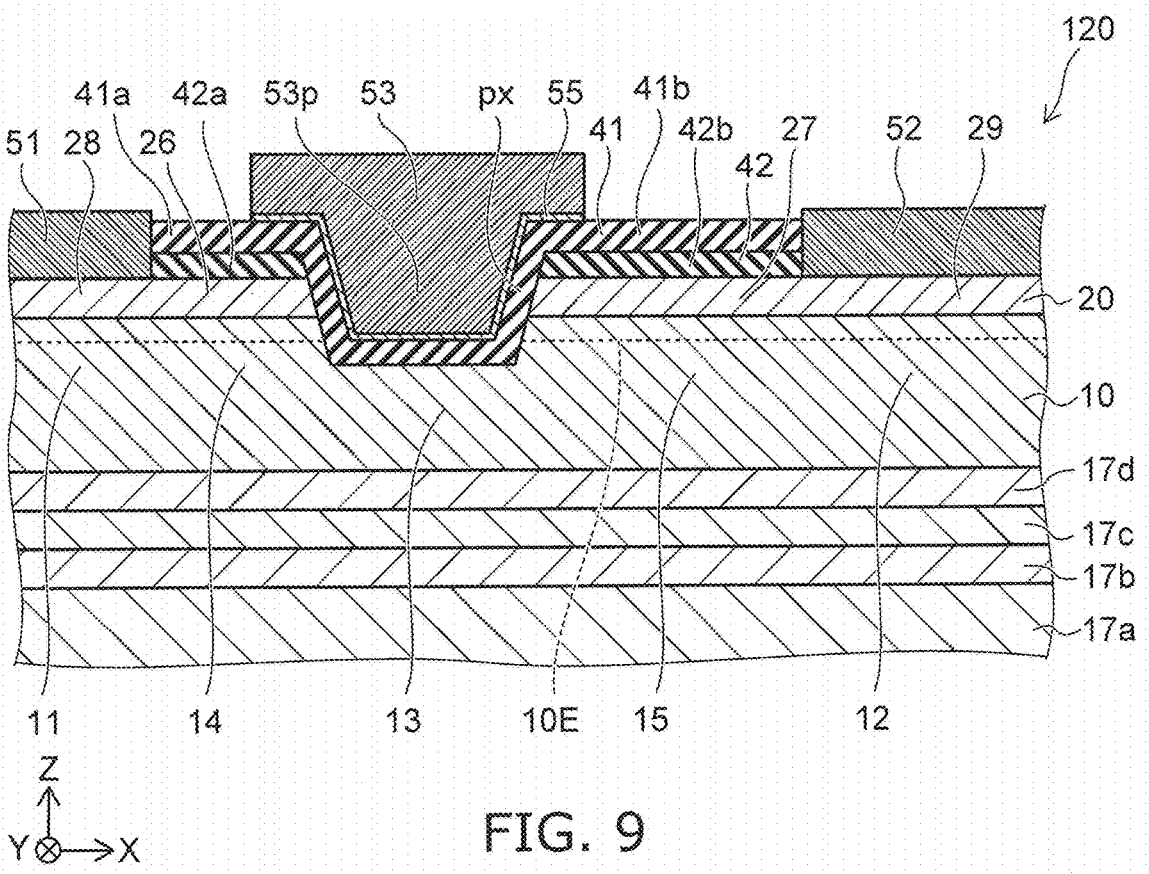
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, the semiconductor device 120 according to the embodiment further includes an intermediate film 55 in addition to the first to third electrodes 51 to 53, the first semiconductor region 10, the second semiconductor region 20, and the first insulating film 41. The intermediate film 55 is provided between the third electrode 53 and the first insulating film 41. The intermediate film 55 includes at least one selected from the group consisting of Pt, Ir, Ni, Pd, Ge, Co, Ge, Au, and Rh. The work function of the intermediate film 55 is higher than the work function of the third electrode 53. By providing the intermediate film 55, for example, the formation of compounds between the first insulating film 41 and the third electrode 53 can be suppressed when forming the third electrode 53 on the first insulating film 41 (e.g., $SiO_2$). For example, oxidization can be suppressed.

The thickness in the first direction (the Z-axis direction) of the intermediate film 55 is, for example, not less than 0.25 nm and not more than 4 nm. The thickness is the thickness along the first direction of the intermediate film 55 between the third electrode 53 and the third partial region 13. When the thickness is less than 0.25 nm, for example, the film properties easily become nonuniform in the heat treatment in the film formation, when patterning, etc. When the thickness is less than 0.25 nm, the effective work function may decrease. When the thickness exceeds 4 nm, for example, the residual stress increases; and the residual stress of the entire element is affected easily.

Figure 10:
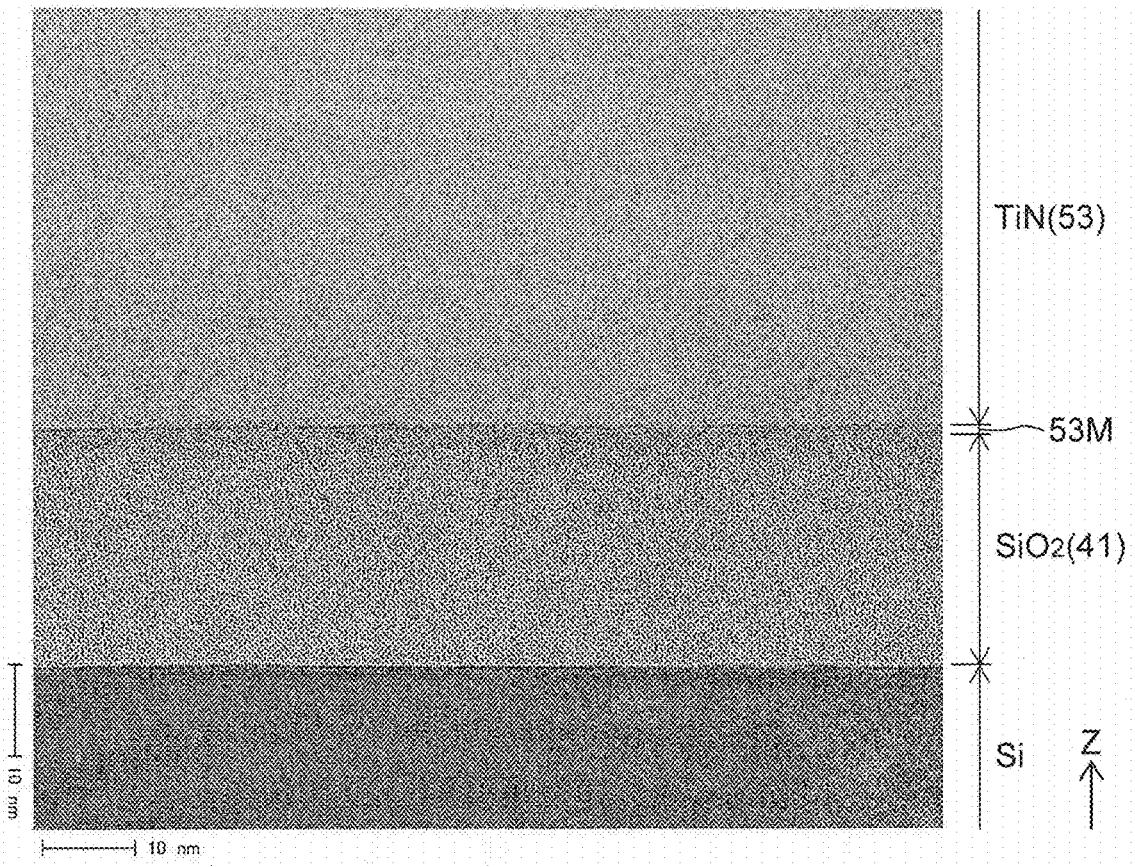
FIG. 10 is an electron microscope photograph illustrating a portion of a sample.

FIG. 10 is an electron microscope photograph illustrating a portion of a sample.

FIG. 10 is a cross-section TEM (Transmission Electron Microscope) image of a sample including the TiN film according to the embodiment. In this sample, the TiN film is formed by sputtering on a $SiO_2$ film provided on a Si substrate. The $SiO_2$ film corresponds to the first insulating film 41. The TiN film corresponds to the third electrode 53. As shown in FIG. 10, an intermediate film region 53M is observed between the $SiO_2$ film and the TiN film. The intermediate film region 53M includes, for example, Ti and oxygen. Such a TiN film may be used as the third electrode 53.

For example, in the case where the first insulating film 41 includes Si and oxygen, the intermediate film region 53M that includes oxygen and the metal included in the third electrode 53 may be provided between the first insulating film 41 and the third electrode 53.

Figure 11:
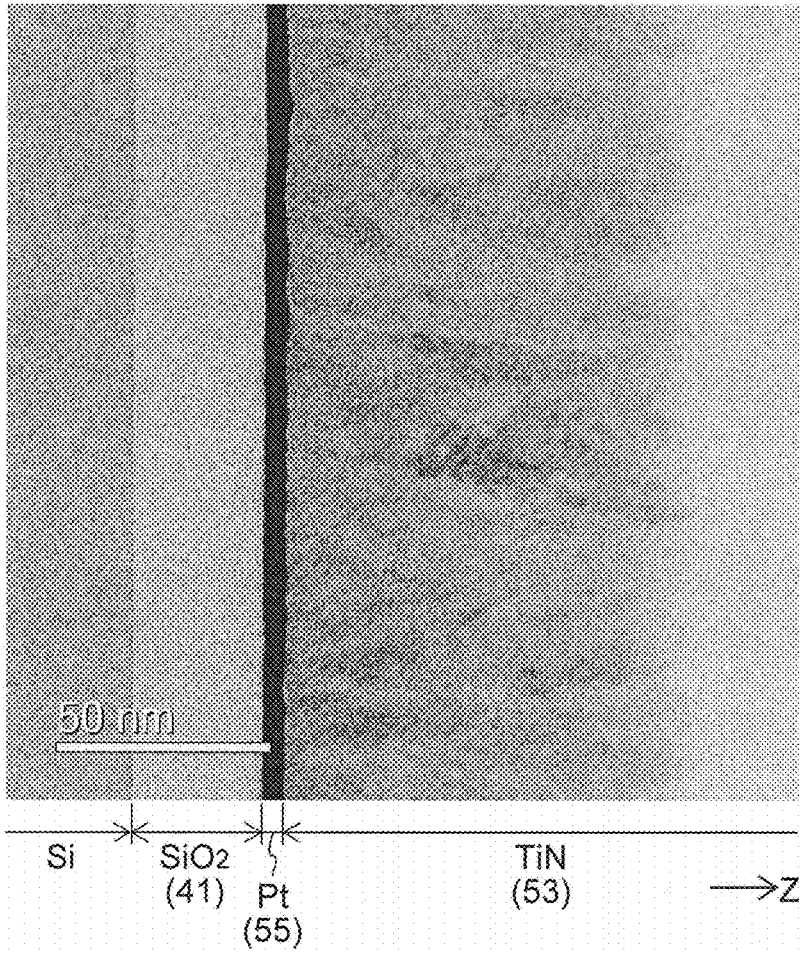
FIG. 11 is an electron microscope photograph illustrating a portion of a sample.

FIG. 11 is an electron microscope photograph illustrating a portion of a sample.

FIG. 11 is a cross-section TEM image of a sample including the TiN film according to the embodiment. In this sample, the intermediate film 55 that includes Pt is formed on a $SiO_2$ film provided on a Si substrate; and the TiN film is formed by sputtering on the intermediate film 55.

As shown in FIG. 11, even in the case where a thin intermediate film 55 is provided between the $SiO_2$ film and the TiN film, a crystal structure of the TiN film is observed. For the TiN film as well, the parameter R1 is 1.5 or more.

Second Embodiment

The embodiment relates to a method for manufacturing a semiconductor device.

Figure 12:
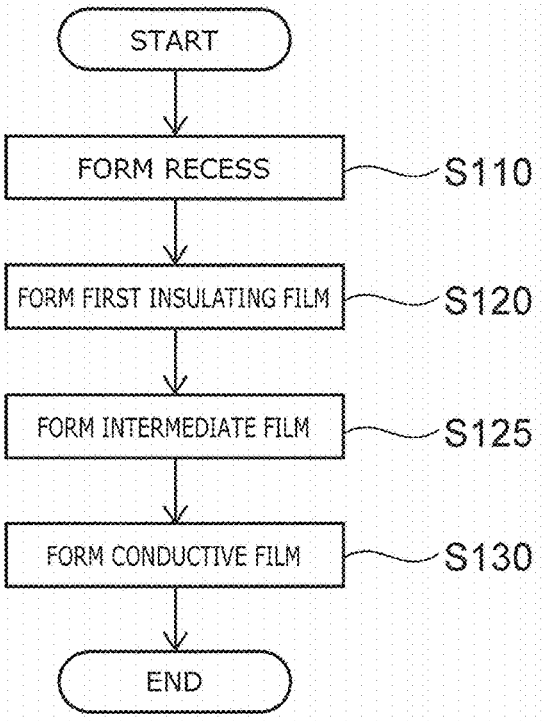
FIG. 12 is a flowchart illustrating the method for manufacturing the semiconductor device according to the second embodiment.

FIG. 12 is a flowchart illustrating the method for manufacturing the semiconductor device according to the second embodiment.

As shown in FIG. 12, the recess 18d is formed in the stacked body 18 (referring to FIG. 1) (step S110). The stacked body 18 includes the first semiconductor region 10 including [$Al_{x2}Ga_{1-x2}N$] $Al_{x1}Ga_{1-x1}N$ ($0 \leq x1 < 1$), and the second semiconductor region 20 including $Al_{x2}Ga_{1-x2}N$ ($0 < x2 \leq 1$ and $x1 < x2$). For example, the recess 18d that reaches the first semiconductor region 10 from the second semiconductor region 20 is formed by removing a portion of the stacked body 18.

The first insulating film 41 is formed in the recess 18d (step S120).

After forming the first insulating film 41, a conductive film (the third electrode 53) is formed in the remaining space of the recess 18d recited above (step S130). The conductive film is formed by sputtering in an atmosphere including argon and nitrogen using a target including a metallic element (e.g., titanium). Thereby, the conductive film (the third electrode 53) that includes a metallic element and nitrogen is formed. The ratio of the flow rate of nitrogen to the flow rate of argon in the atmosphere of the sputtering is not less than 0.077 and not more than 0.16.

Thereby, for example, in the X-ray analysis measurement, the ratio of the second peak intensity corresponding to the (220) orientation of the conductive film (the third electrode 53) to the first peak intensity corresponding to the (111) orientation of the conductive film (the third electrode 53) is 1.5 or more. For example, in the case where the metallic element recited above is titanium, the density of the conductive film (the third electrode 53) is 3.93 g/cm$^3$ or less.

The threshold voltage can be increased by such a conductive film (the third electrode 53). According to the embodiment, a method for manufacturing a semiconductor device can be provided in which more stable characteristics can be obtained.

As shown in FIG. 12, the intermediate film 55 also may be formed (step S125) between the formation of the first insulating film 41 (step S120) and the formation of the conductive film (step S130). The intermediate film 55 is formed in the recess 18d. The intermediate film 55 includes at least one selected from the group consisting of Pt, Ir, Ni, and Pr.

In the embodiment, the first electrode 51 and the second electrode (referring to FIG. 1) also may be formed. The first electrode 51 is electrically connected to the first partial region 11 of the stacked body 18 (referring to FIG. 1). The second electrode is electrically connected to the second partial region 12 of the stacked body 18. As shown in FIG. 1, the recess 18d is positioned between the first partial region 11 and the second partial region 12.

According to the embodiments, a semiconductor device and a method for manufacturing the semiconductor device can be provided in which stable characteristics can be obtained.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a second electrode;

a first semiconductor region including [$Al_{x2}Ga_{1-x2}N$] $Al_{x1}Ga_{1-x1}N$ ($0 \leq x1 < 1$), the first semiconductor region including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction, the second direction being from the first electrode toward the second electrode, a direction from the second partial region toward the second electrode being aligned with the first direction;

a second semiconductor region including $Al_{x2}Ga_{1-x2}N$ ($0 < x2 \leq 1$ and $x1 < x2$), the second semiconductor region including a sixth partial region and a seventh partial region, a direction from the fourth partial region toward the sixth partial region being aligned with the first direction, a direction from the fifth partial region toward the seventh partial region being aligned with the first direction;

a third electrode, a direction from the third partial region toward the third electrode being aligned with the first direction, the third electrode overlapping the sixth partial region and the seventh partial region in the second direction; and a first insulating film including a portion provided between the third electrode and the third partial region, between the third electrode and the fourth partial region, between the third electrode and the fifth partial region, between the third electrode and the sixth partial region, and between the third electrode and the seventh partial region, in an X-ray analysis measurement, a ratio of a second peak intensity to a first peak intensity being 1.5 or more, the first peak intensity corresponding to a (111) orientation of the third electrode, the second peak intensity corresponding to a (220) orientation of the third electrode.

2. The device according to claim 1, wherein the third electrode has an NaCl-type crystal structure.

3. The device according to claim 1, wherein the third electrode includes titanium and nitrogen.

4. A semiconductor device, comprising:

a first electrode;

a second electrode;

a first semiconductor region including [$Al_{x2}Ga_{1-x2}N$] $Al_{x1}Ga_{1-x1}N$ ($0 \leq x1 < 1$), the first semiconductor region including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction, the second direction being from the first electrode toward the second electrode, a direction from the second partial region toward the second electrode being aligned with the first direction;

a second semiconductor region including $Al_{x2}Ga_{1-x2}N$ ($0 < x2 \leq 1$ and $x1 < x2$), the second semiconductor region including a sixth partial region and a seventh partial region, a direction from the fourth partial region toward the sixth partial region being aligned with the first direction, a direction from the fifth partial region toward the seventh partial region being aligned with the first direction;

a third electrode including titanium and nitrogen, a direction from the third partial region toward the third electrode being aligned with the first direction, the third electrode overlapping the sixth partial region and the seventh partial region in the second direction, a density of the third electrode being 3.93 g/cm$^3$ or less; and a first insulating film including a portion provided between the third electrode and the third partial region, between the third electrode and the fourth partial region, between the third electrode and the fifth partial region, between the third electrode and the sixth partial region, and between the third electrode and the seventh partial region.

5. The device according to claim 4, wherein the second insulating film includes nitrogen, and the first insulating film does not include nitrogen, or a concentration of nitrogen in the first insulating film is lower than a concentration of nitrogen in the second insulating film.

6. The device according to claim 4, wherein the portion of the second insulating film is provided between the sixth partial region and a portion of the first insulating film, and the other portion of the second insulating film is provided between the seventh partial region and an other portion of the first insulating film.

7. The device according to claim 1, further comprising an intermediate film including at least one selected from the group consisting of Pt, Ir, Ni, Pd, Ge, Co, Ge, Au, and Rh and being provided between the third electrode and the first insulating film.

8. The device according to claim 7, wherein a thickness of the intermediate film along the first direction between the third electrode and the third partial region is not less than 0.25 nm and not more than 4 nm.

9. The device according to claim 1, wherein the third electrode includes a portion overlapping the third partial region in the first direction, and a thickness along the first direction of the overlapping portion is not less than 10 nm and not more than 100 nm.

10. The device according to claim 7, wherein the intermediate film includes a first intermediate portion between the third electrode and the third partial region, the third electrode includes a portion overlapping the third partial region in the first direction, and a thickness along the first direction of the overlapping portion is not less than 5 times and not more than 100 times a thickness along the first direction of the first intermediate portion.

11. The device according to claim 1, wherein the first insulating film is provided, in the first direction, between the fourth partial region and a portion of the third electrode and between the fifth partial region and an other portion of the third electrode.

12. The device according to claim 1, wherein the first insulating film includes a first insulating portion between the third electrode and the third partial region in the first direction, and a distance along the first direction between a position in the first direction of a boundary between the first insulating portion and the third electrode and a position in the first direction of a boundary between the fourth partial region and the sixth partial region is not less than 0.1 nm and not more than 15 nm.

13. The device according to claim 1, wherein the first insulating film includes a first insulating portion between the third electrode and the third partial region in the first direction, and a thickness along the first direction of the first insulating portion is not less than 0.1 nm and not more than 50 nm.

14. A semiconductor device, comprising:

a first electrode;

a second electrode;

a first semiconductor region including $Al_{x2}Ga_{1-x2}N$ ($0 \leq x1 < 1$), the first semiconductor region including a first partial region, a second partial region, a third partial region between the first partial region and the second partial region, a fourth partial region between the first partial region and the third partial region, and a fifth partial region between the third partial region and the second partial region, a first direction from the first partial region toward the first electrode crossing a second direction, the second direction being from the first electrode toward the second electrode, a direction from the second partial region toward the second electrode being aligned with the first direction;

a second semiconductor region including $Al_{x2}Ga_{1-x2}N$ ($0 < x2 \leq 1$ and $x1 < x2$), the second semiconductor region including a sixth partial region and a seventh partial region, a direction from the fourth partial region toward the sixth partial region being aligned with the first direction, a direction from the fifth partial region toward the seventh partial region being aligned with the first direction;

a third electrode including titanium and nitrogen, a direction from the third partial region toward the third electrode being aligned with the first direction, the third electrode overlapping the sixth partial region and the seventh partial region in the second direction, a density of the third electrode being 3.93 g/cm$^3$ or less; and a first insulating film including a portion provided between the third electrode and the third partial region, between the third electrode and the fourth partial region, between the third electrode and the fifth partial region, between the third electrode and the sixth partial region, and between the third electrode and the seventh partial region wherein the third electrode overlaps the fourth partial region and the fifth partial region in the second direction.

15. A method for manufacturing a semiconductor device, comprising:

forming a recess in a stacked body by removing a portion of the stacked body, the stacked body including a first semiconductor region and a second semiconductor region, the first semiconductor region including $Al_{x2}Ga_{1-x2}N$ ($0 \leq x1 < 1$), the second semiconductor region including $Al_{x2}Ga_{1-x2}N$ ($0 < x2 \leq 1$ and $x1 < x2$), the recess reaching the first semiconductor region from the second semiconductor region;

forming a first insulating film in the recess; and forming a conductive film by sputtering in a space remaining in the recess after the forming of the first insulating film, the conductive film including a metallic element and nitrogen, the sputtering being performed using a target including the metallic element, the sputtering being performed in an atmosphere including argon and nitrogen and having a ratio of a flow rate of nitrogen to a flow rate of argon not less than 0.077 and not more than 0.16.

[16. The method according to claim 15, wherein the metallic element includes titanium.]

[17. The method according to claim 15, further comprising forming an intermediate film including at least one selected from the group consisting of Pt, Ir, Ni, and Pr in the recess between the forming of the first insulating film and the forming of the conductive film.]

[18. The method according to claim 15, further comprising forming a first electrode and a second electrode, the first electrode being electrically connected to a first partial region of the stacked body, the second electrode being electrically connected to a second partial region of the stacked body, the recess being positioned between the first partial region and the second partial region.]

*19. The device according to claim 1, wherein, the second peak intensity corresponding to the (220) orientation has a higher value than that of a third peak intensity corresponding to a (200) orientation of the third electrode.*

*20. The device according to claim 1, further comprising an intermediate film provided between the third electrode and the first insulating film.*

* * * * *